(12) United States Patent
Chuang et al.

(10) Patent No.: US 9,691,969 B2
(45) Date of Patent: Jun. 27, 2017

(54) SEMICONDUCTOR INTEGRATED CIRCUIT AND METHOD OF MAKING THE SAME

(71) Applicant: TAIWAN SEMICONDUCTOR MANUFACTURING COMPANY LTD., Hsinchu (TW)

(72) Inventors: Harry Hak-Lay Chuang, Paya Lebar Crescent (SG); Tien-Wei Chiang, Taipei (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 0 days.

(21) Appl. No.: 14/871,731

(22) Filed: Sep. 30, 2015

(65) Prior Publication Data

US 2017/0092845 A1    Mar. 30, 2017

(51) Int. Cl.
*H01L 43/08*    (2006.01)
*H01L 43/02*    (2006.01)
*G11C 11/16*    (2006.01)
*H01L 27/22*    (2006.01)
*H01L 43/12*    (2006.01)

(52) U.S. Cl.
CPC ............ *H01L 43/08* (2013.01); *G11C 11/161* (2013.01); *H01L 27/222* (2013.01); *H01L 27/226* (2013.01); *H01L 43/02* (2013.01); *H01L 43/12* (2013.01)

(58) Field of Classification Search
CPC ..... H01L 43/08; H01L 27/228; H01L 27/222; H01L 27/226
See application file for complete search history.

(56) References Cited

U.S. PATENT DOCUMENTS

2013/0058161 A1*    3/2013    Yamanaka ............... G11C 11/16
365/173

* cited by examiner

*Primary Examiner* — Amar Movva
(74) *Attorney, Agent, or Firm* — WPAT, P.C., Intellectual Property Attorneys; Anthony King

(57) ABSTRACT

The present disclosure relates to a semiconductor integrated circuit which includes a substrate, a first patterned conductive layer, a first magnetic tunnel junction (MTJ) stack and a second MTJ stack. The first patterned conductive layer is over the substrate. The first MTJ stack, which is over the first patterned conductive layer, has a first size. The second MTJ stack, which is over the first patterned conductive layer, has a second size different from the first size.

20 Claims, 27 Drawing Sheets

SEMICONDUCTOR INTEGRATED CIRCUIT AND METHOD OF MAKING THE SAME

BACKGROUND

Circuits of data or signal processing contain memories to store data. To fulfill high-speed processing requirements of circuits, it would be necessary to minimize both read and write time of memories. An example of such memories is SRAM (Static Random Access Memory) with capability to provide rapid access of contents stored therein. Nevertheless, SRAM retains its contents as long as electrical power is applied to the circuits. If the power is turned off or lost temporarily, its contents will be lost. Moreover, SRAM, which generally has a 6-transistor memory cell structure, may inevitably consume a large space of circuits.

The circuits may need another type of memories to retain data while power is turned off. Flash memory has an advantage in that data recorded therein is still preserved even power is turned off. However, speed of writing data into flash memory is relatively slower as compared to that of SRAM.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 1A, FIG. 1B, FIG. 1C, FIG. 1D, FIG. 1E, FIG. 1F, FIG. 1G, FIG. 1H, FIG. 1I, FIG. 1J, FIG. 1K, FIG. 1L, FIG. 1M, FIG. 1N, FIG. 1O, FIG. 1P, FIG. 1Q, FIG. 1R, FIG. 1S, FIG. 1T, FIG. 1U, FIG. 1V and FIG. 1W illustrate a manufacturing method in accordance with some embodiments of the present disclosure.

DETAILED DESCRIPTION

Figure 1A:
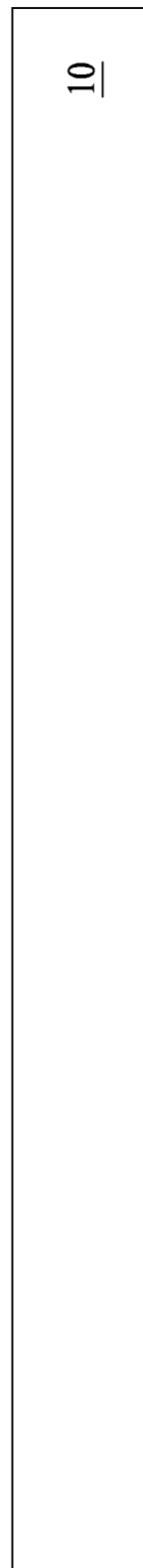

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

To integrate SRAM and flash memory in one circuit or one single chip will be a challenge due to the complexity and different manufacturing process of memories. Further, even SRAM and flash memory may be integrated in a single circuit or chip, it may still consume extra area of the integrated circuit.

FIG. 1A, FIG. 1B, FIG. 1C, FIG. 1D, FIG. 1E, FIG. 1F, FIG. 1G, FIG. 1H, FIG. 1I, FIG. 1J, FIG. 1K, FIG. 1L, FIG. 1M, FIG. 1N, FIG. 1O, FIG. 1P, FIG. 1Q, FIG. 1R, FIG. 1S, FIG. 1T, FIG. 1U, FIG. 1V and FIG. 1W illustrate a manufacturing method in accordance with some embodiments of the present disclosure.

Referring to FIG. 1A, a semiconductor substrate 10 is provided. The semiconductor substrate 10 may be but is not limited to, for example, a silicon substrate. A number of shallow trench isolation (STI) regions (not shown in FIG. 1A) are formed in the semiconductor substrate 10. The STI regions, which may be formed of suitable dielectric materials, may be provided to isolate a transistor (not shown in FIG. 1A) electrically from neighboring semiconductor devices such as other transistors (not shown in FIG. 1A). The STI regions may, for example, include an oxide (e.g., Ge oxide), an oxynitride (e.g., GaP oxynitride), silicon dioxide ($SiO_2$), a nitrogen-bearing oxide (e.g., nitrogen-bearing $SiO_2$), a nitrogen-doped oxide (e.g., $N_2$-implanted $SiO_2$), silicon oxynitride ($Si_xO_yN_z$), and the like. The STI regions may also be formed of any suitable "high dielectric constant" or "high K" material, where K is greater than or equal to about 8, such as titanium oxide ($Ti_xO_y$, e.g., $TiO_2$), tantalum oxide ($Ta_xO_y$, e.g., $Ta_2O_5$), barium strontium titanate (BST, $BaTiO_3/SrTiO_3$), and the like. Alternatively, the STI regions may also be formed of any suitable "low dielectric constant" or "low K" dielectric material, where K is less than or equal to about 4.

Figure 1B:
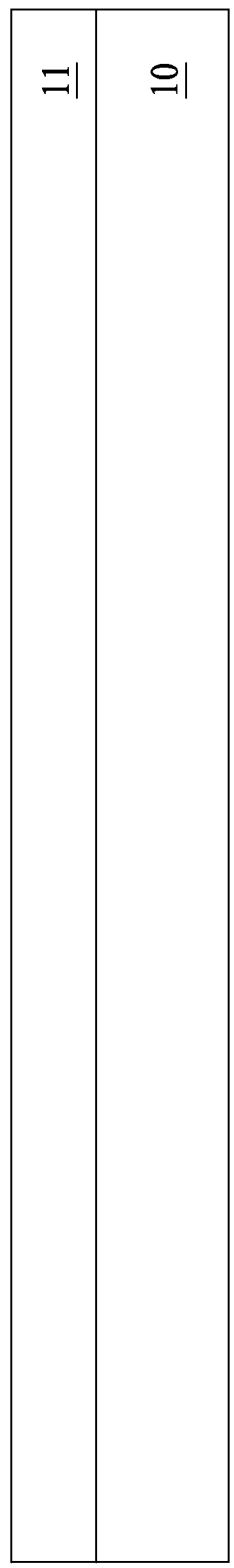

Referring to FIG. 1B, a dielectric layer 11 is formed on the semiconductor substrate 10. The dielectric layer 11 may be formed by a variety of techniques for forming such layers, e.g., chemical vapor deposition (CVD), low-pressure CVD (LPCVD), plasma-enhanced CVD (PECVD), sputtering and physical vapor deposition (PVD), thermal growing, and the like. The dielectric layer 11 above the semiconductor substrate 10 may have a thickness ranging up to approximately 400 Å, for example, and may be formed from a variety of dielectric materials and may, for example, be an oxide (e.g., Ge oxide), an oxynitride (e.g., GaP oxynitride), silicon dioxide ($SiO_2$), a nitrogen-bearing oxide (e.g., nitrogen-bearing $SiO_2$), a nitrogen-doped oxide (e.g., $N_2$-implanted $SiO_2$), silicon oxynitride ($Si_xO_yN_z$), and the like.

The dielectric layer 11 may also be formed of any suitable "high dielectric constant" or "high K" material, where K is greater than or equal to about 8, such as titanium oxide ($Ti_xO_y$, e.g., $TiO_2$), tantalum oxide ($Ta_xO_y$, e.g., $Ta_2O_5$), barium strontium titanate (BST, $BaTiO_3/SrTiO_3$), and the like. The dielectric layer 11 may have an equivalent oxide thickness $t_{ox-eq}$ ranging up to approximately 50 Å, for example. An equivalent oxide thickness $t_{ox-eq}$ may be defined to be the thickness t of a dielectric material (with a dielectric constant K) that would have a capacitance per unit area C that is approximately the same as the capacitance per unit area $C_{ox}$ that a thickness $t_{ox-eq}$ of silicon dioxide ($SiO_2$) would have.

Figure 1C:
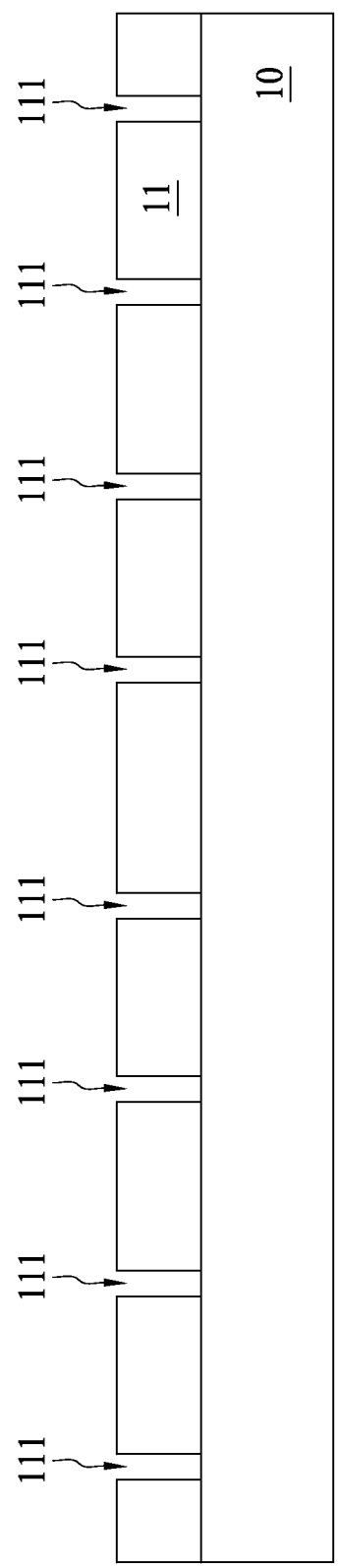

Referring to FIG. 1C, a number of through holes 111 are formed in the dielectric layer 11 by, for example, photolithographic technique.

Figure 1D:
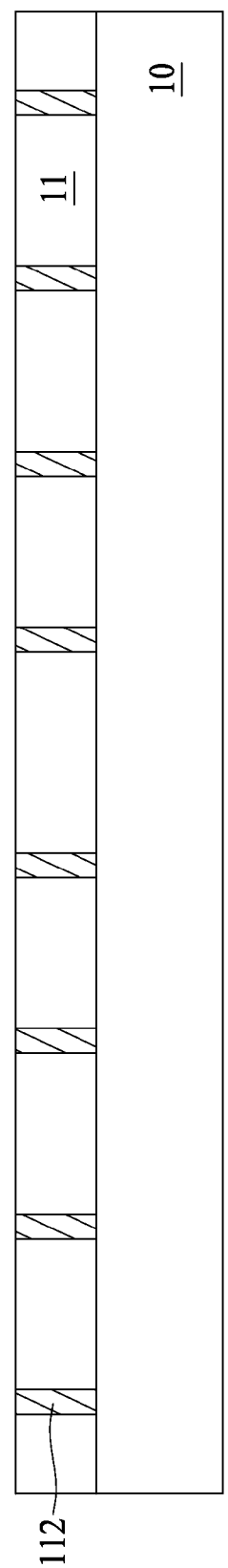

Referring to FIG. 1D, the through holes 111 are filled with electrically conductive material, e.g. copper, gold or another suitable metal or alloy, to form a number of conductive vias or pillars 112. The conductive vias 112 may be electrically connected to semiconductor devices such as transistors (not shown in FIG. 1D) in the semiconductor substrate 10. The conductive vias 112 may be formed by a variety of techniques, e.g., electroplating, electroless plating, high-density ionized metal plasma (IMP) deposition, high-density inductively coupled plasma (ICP) deposition, sputtering, physical vapor deposition (PVD), chemical vapor deposition (CVD), low-pressure chemical vapor deposition (LPCVD), plasma-enhanced chemical vapor deposition (PECVD), and the like.

Figure 1E:
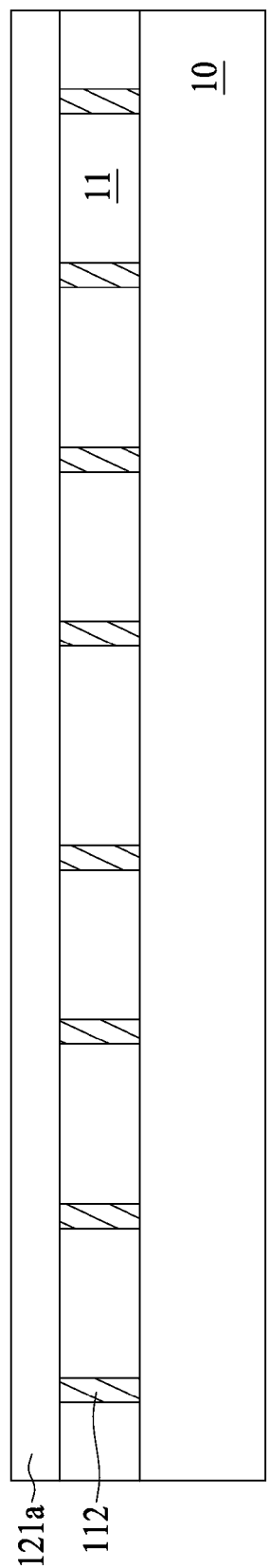

Referring to FIG. 1E, a dielectric layer 121a is formed on the dielectric layer 11 by same or similar techniques as illustrated and described with reference to FIG. 1B. The dielectric layer 121a may have material the same or similar to that of the dielectric layer 11.

Figure 1F:
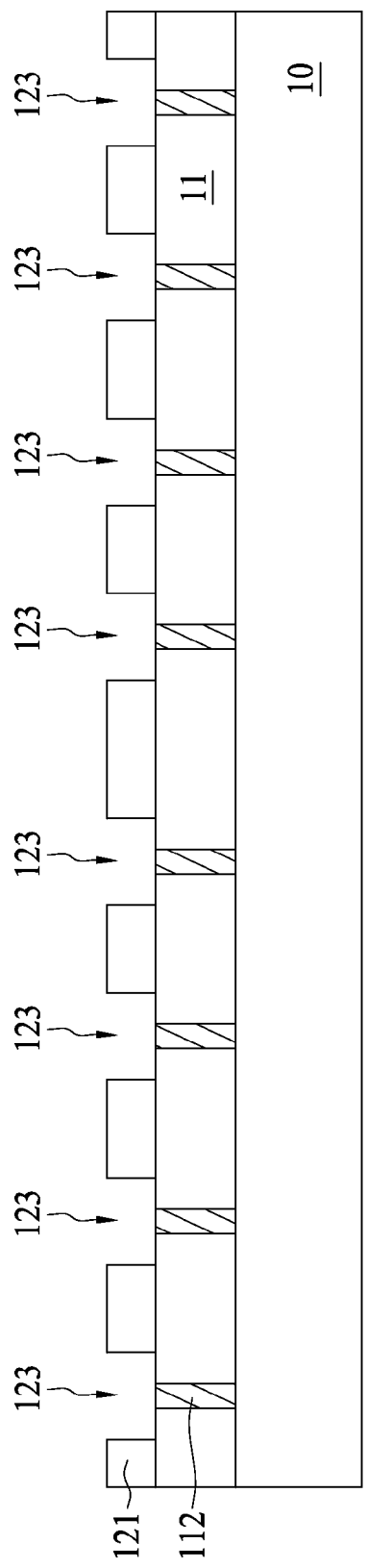

Referring to FIG. 1F, parts of the dielectric layer 121a are removed to form a patterned dielectric layer 121 by, for example, photolithographic technique. The patterned dielectric layer 121 may have a number of openings 123.

Figure 1G:
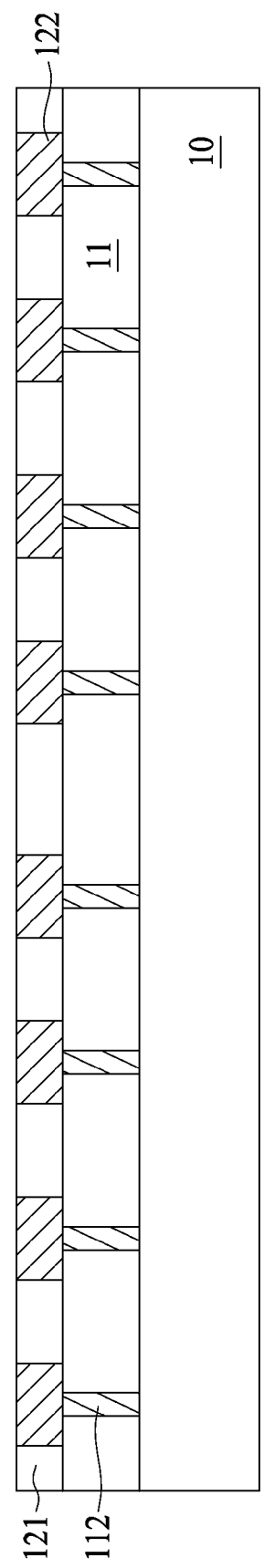

Referring to FIG. 1G, the openings 123 are filled with electrically conductive material, e.g. copper, gold or another suitable metal or alloy, to form a patterned conductive layer 122. The patterned conductive layer 122 may be electrically connected to the conductive vias 112. The patterned conductive layer 122 may be formed by same or similar techniques as illustrated and described with reference to FIG. 1D. The patterned conductive layer 122 may include traces, contact pads, vias, or other electrical connections/paths.

Figure 1H:
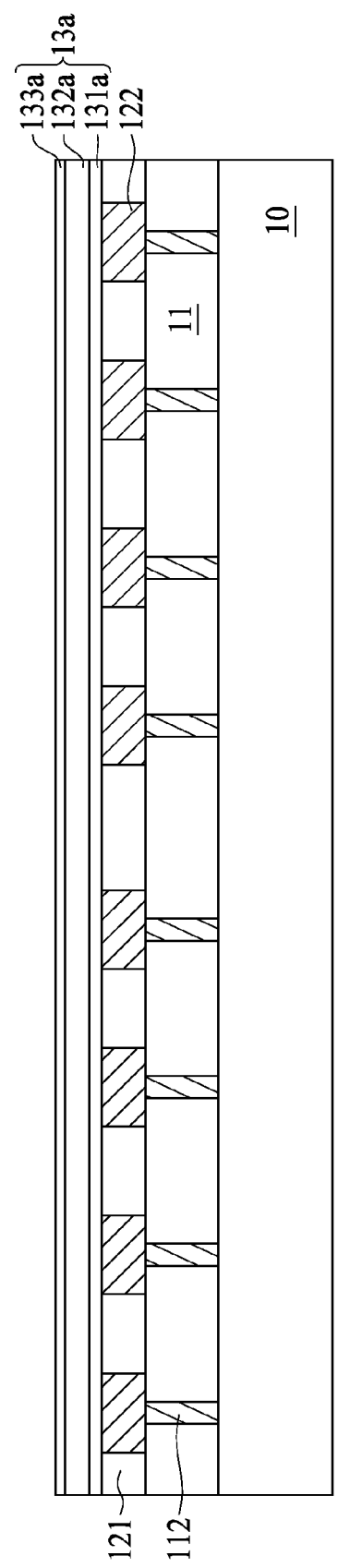

Referring to FIG. 1H, a dielectric layer 13a is formed on the patterned conductive layer 122 by same or similar techniques as illustrated and described with reference to FIG. 1B. The dielectric layer 13a may have material the same or similar to that of the dielectric layer 11 as illustrated and described with reference to FIG. 1B. The dielectric layer 13a may have a multi-layer structure, which include a dielectric layer 131a, a dielectric layer 132a on the dielectric layer 131a, and a dielectric layer 133a on the dielectric layer 132a. Each of the dielectric layers 131a, 132a and 133a may be formed by same or similar techniques as illustrated and described with reference to FIG. 1B. Each of the dielectric layers 131a, 132a and 133a may have material the same or similar to that of the dielectric layer 11. It is contemplated that the dielectric layer 13a may have a single-layer structure in accordance some other embodiments.

Figure 1I:
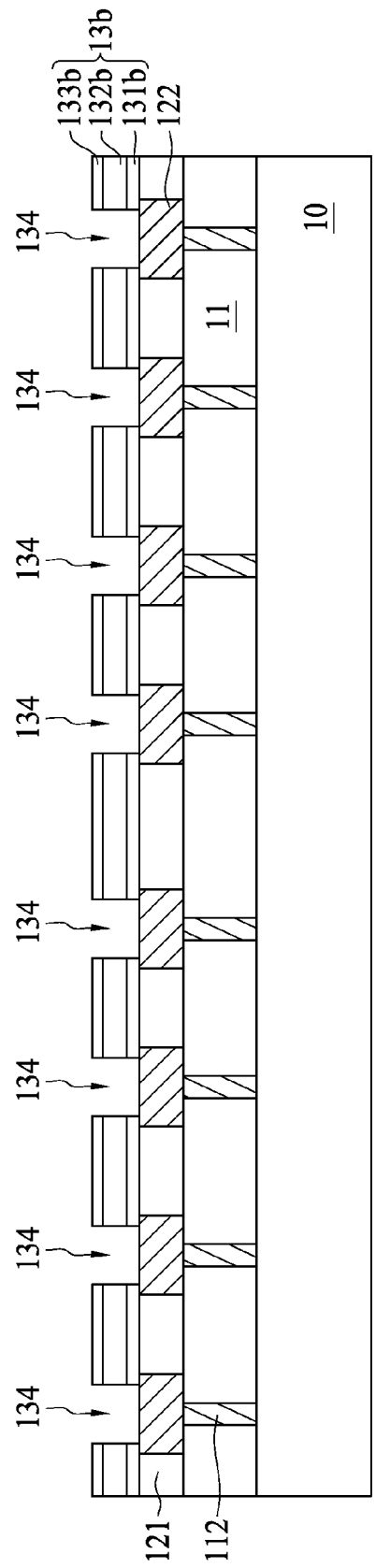

Referring to FIG. 1I, parts of the dielectric layer 13a are removed to form a patterned dielectric layer 13b by, for example, photolithographic technique. The patterned dielectric layer 13b may have a number of openings 134. The patterned dielectric layer 13b may include a patterned dielectric layer 131b, a patterned dielectric layer 132b on the patterned dielectric layer 131b, and a patterned dielectric layer 133b on the patterned dielectric layer 132b.

Figure 1J:
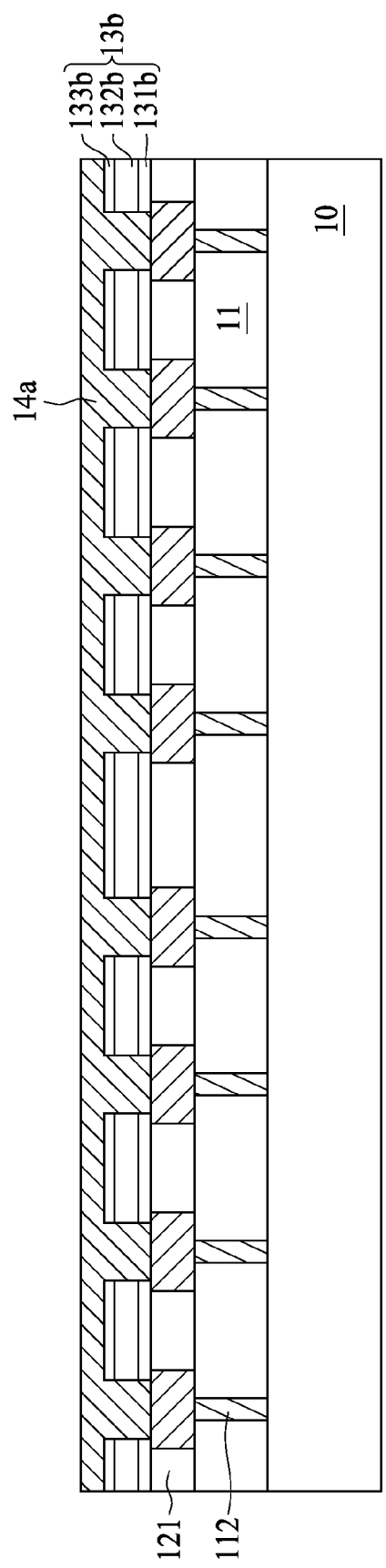

Referring to FIG. 1J, a conductive layer 14a is formed on the patterned conductive layer 122 to cover the patterned dielectric layer 13b. The conductive layer 14a may be formed by a variety of techniques, e.g., high-density ionized metal plasma (IMP) deposition, high-density inductively coupled plasma (ICP) deposition, sputtering, physical vapor deposition (PVD), chemical vapor deposition (CVD), low-pressure chemical vapor deposition (LPCVD), plasma-enhanced chemical vapor deposition (PECVD), and the like, and may have a thickness ranging from approximately 50 Å to approximately 500 Å. The conductive layer 14a may include tantalum, copper, gold or another suitable metal or alloy.

Figure 1K:
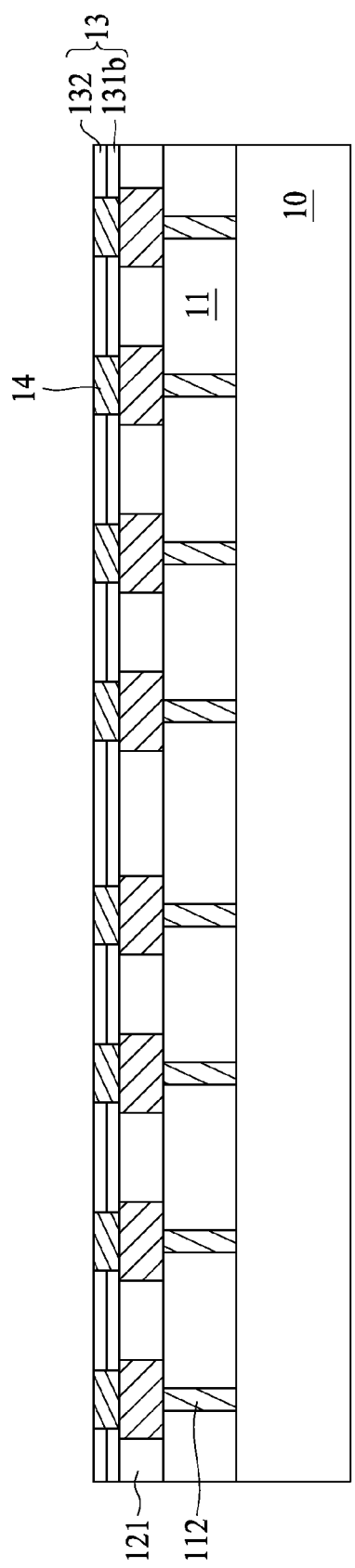

Referring to FIG. 1K, the patterned dielectric layer 133b, part of the conductive layer 14a and part of the patterned dielectric layer 132b are removed by, for example, Chemical-Mechanical Planarization (CMP) or Chemical-Mechanical Polishing (CMP) technique to form a patterned dielectric layer 13 and a number of electrodes 14. The patterned dielectric layer 13 includes the patterned dielectric layer 131b and a patterned dielectric layer 132 on the patterned dielectric layer 131b. The patterned dielectric layer 132b as shown in FIG. 1J may function as a stop layer during the operation performed in FIG. 1K. The patterned dielectric layer 132 may be a remnant of the patterned dielectric layer 132b. The electrodes 14 may be a remnant of the conductive layer 14a. The patterned dielectric layer 13 laterally surrounds the electrodes 14.

Figure 1L:
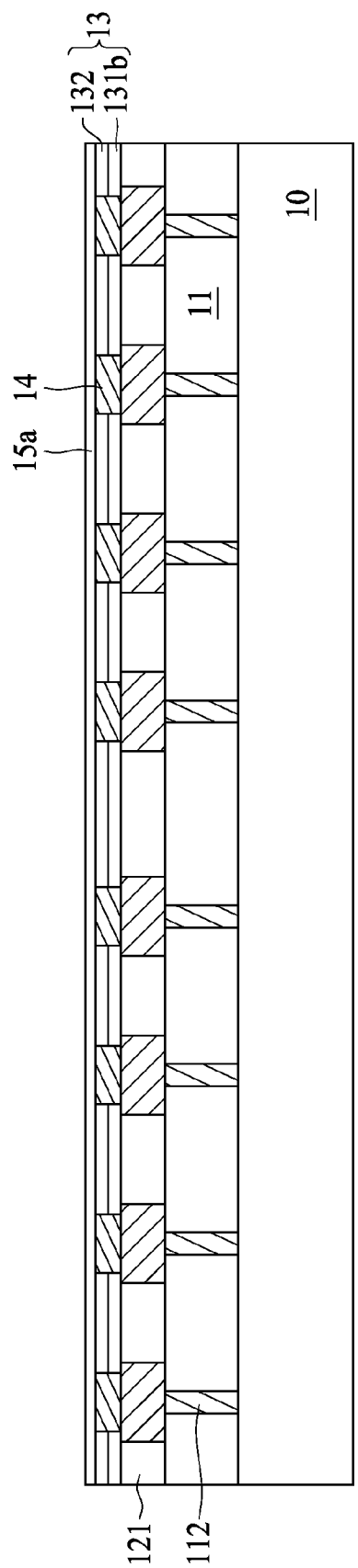
Figure 1M:
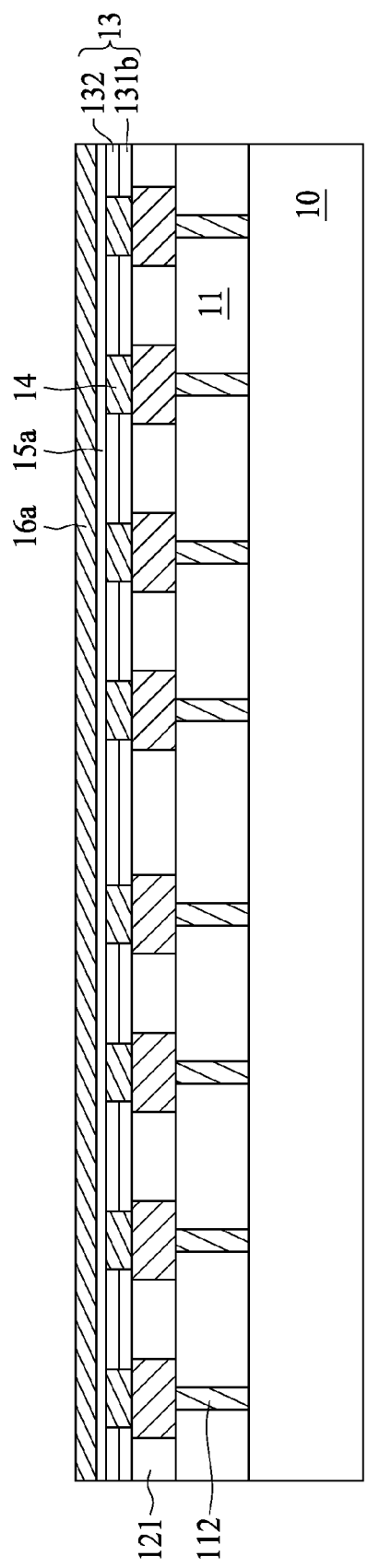

Referring to FIG. 1L, a magnetic tunnel junction (MTJ) layer 15a is formed on the electrodes 14 and patterned dielectric layer 13. The MTJ layer 15a may be formed by variety of techniques, e.g., high-density ionized metal plasma (IMP) deposition, high-density inductively coupled plasma (ICP) deposition, sputtering, physical vapor deposition (PVD), chemical vapor deposition (CVD), low-pressure chemical vapor deposition (LPCVD), plasma-enhanced chemical vapor deposition (PECVD), and the like, and may have a thickness ranging from approximately 400 Å to approximately 700 Å. The MTJ layer 15a may have a multi-layer structure. More specific description of the MTJ layer 15a may be referred to following description with reference to FIG. 4 and FIG. 5.

Figure 4:
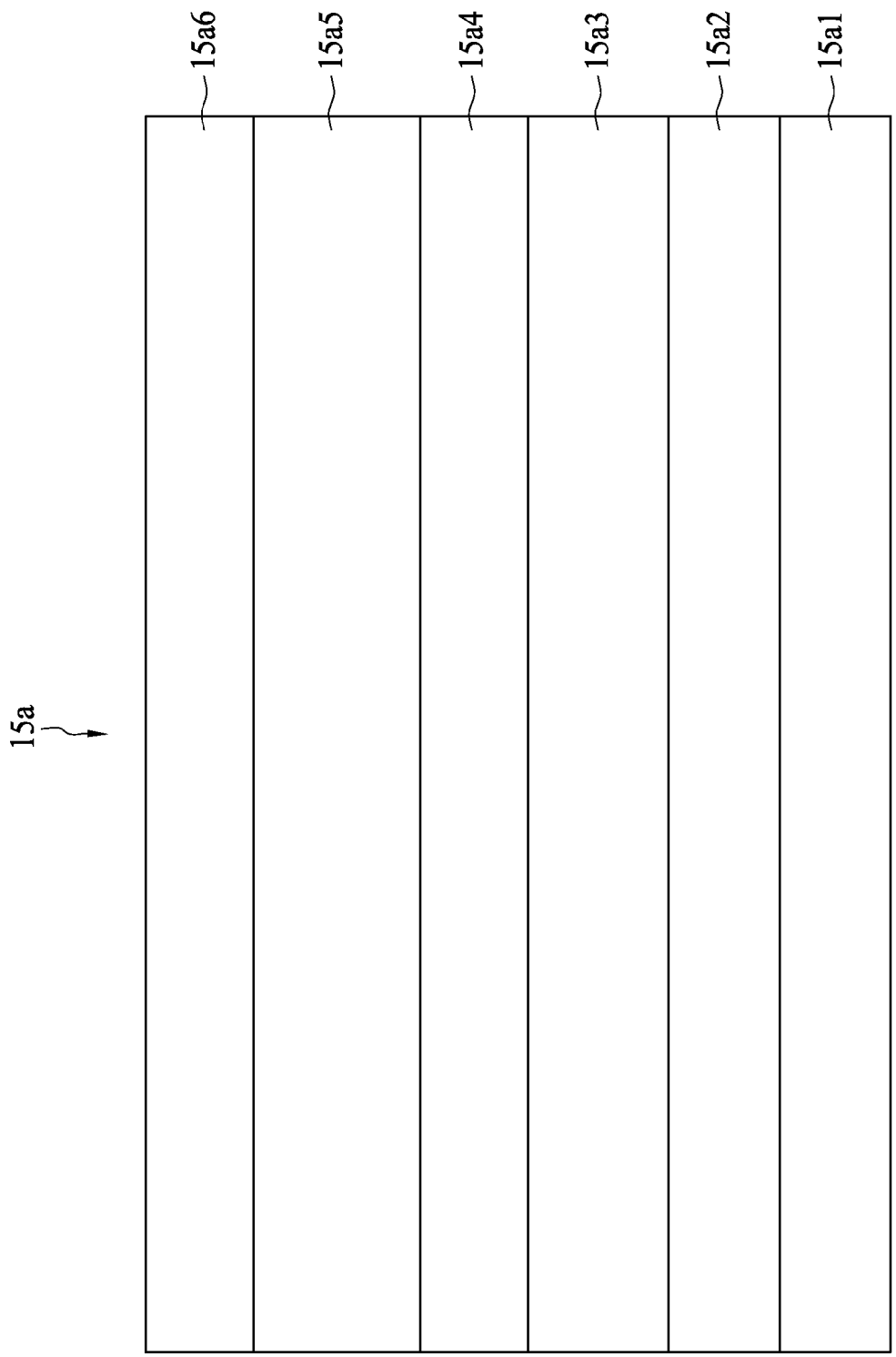
FIG. 4 illustrates a magnetic tunnel junction layer in accordance with some embodiments of the present disclosure.

FIG. 4 illustrates a magnetic tunnel junction layer in accordance with some embodiments of the present disclosure. Referring to FIG. 4, the MTJ layer 15a may include ferromagnetic layers 15a1, 15a3 and 15a5, spacers 15a2 and 15a4, and a capping layer 15a6. The spacer 15a2 is formed on the ferromagnetic layer 15a1. The ferromagnetic layer 15a3 is formed on the spacer 15a2. The spacer 15a4 is formed on the ferromagnetic layer 15a3. The ferromagnetic layer 15a5 is formed on the spacer 15a4. The capping layer 15a6 is formed on the ferromagnetic layer 15a5. Each of the ferromagnetic layers 15a1, 15a3 and 15a5 may include ferromagnetic material, which may be metal or metal alloy, for example, Fe, Co, Ni, CoFeB, FeB, CoFe, FePt, FePd, CoPt, CoPd, CoNi, TbFeCo, CrNi or the like. The spacer 15a2 may include non-ferromagnetic metal, for example, Ag, Au, Cu, Ta, W, Mn, Pt, Pd, V, Cr, Nb, Mo, Tc, Ru or the like. The spacer 15a4 may include insulator, for example, Al2O3, MgO, TaO, RuO or the like. The capping layer 15a6 may include non-ferromagnetic material, which may be a metal or an insulator, for example, Ag, Au, Cu, Ta, W, Mn, Pt, Pd, V, Cr, Nb, Mo, Tc, Ru, Ir, Re, Os, $Al_2O_3$, MgO, TaO, RuO or the like. The capping layer 15a6 may reduce write current of its associated magnetic random access memory (MRAM) cell. The ferromagnetic layer 15a5 may function as a free layer whose magnetic polarity or magnetic orientation can be changed during write operation of its associated MRAM cell. The ferromagnetic layers 15a1, 15a3 and the spacer 15a2 may function as a fixed or pinned layer whose magnetic orientation may not be changed during operation of its associated MRAM cell. It is contemplated that the MTJ layer 15a may include an anti-ferromagnetic layer (not shown in FIG. 4) in accordance with other embodiments.

Figure 5:
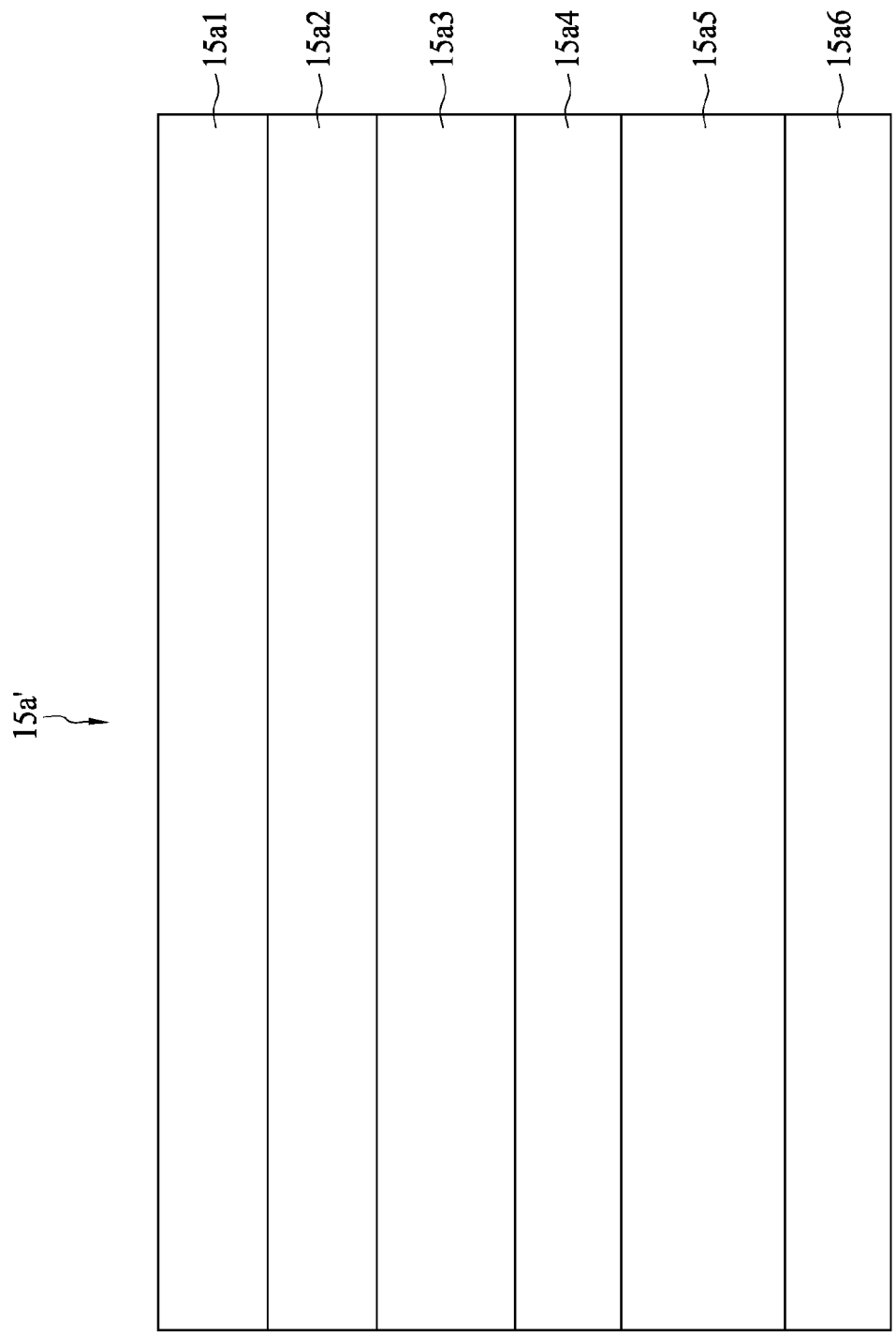
FIG. 5 illustrates another magnetic tunnel junction layer in accordance with some embodiments of the present disclosure.

FIG. 5 illustrates another magnetic tunnel junction layer in accordance with some embodiments of the present disclosure. Referring to FIG. 5, the MTJ layer 15a' is similar to the MTJ layer 15a except that the MTJ layer 15a' is an upside-down structure of the MTJ layer 15a.

Referring back to FIG. 1M, a conductive layer 16a is formed on the MTJ layer 15a. The conductive layer 16a may be formed by a variety of techniques, e.g., high-density ionized metal plasma (IMP) deposition, high-density inductively coupled plasma (ICP) deposition, sputtering, physical vapor deposition (PVD), chemical vapor deposition (CVD), low-pressure chemical vapor deposition (LPCVD), plasma-enhanced chemical vapor deposition (PECVD), and the like, and may have a thickness ranging from approximately 500 Å to approximately 1000 Å. The conductive layer 16a may include tantalum, copper, gold or another suitable metal or alloy.

Figure 1N:
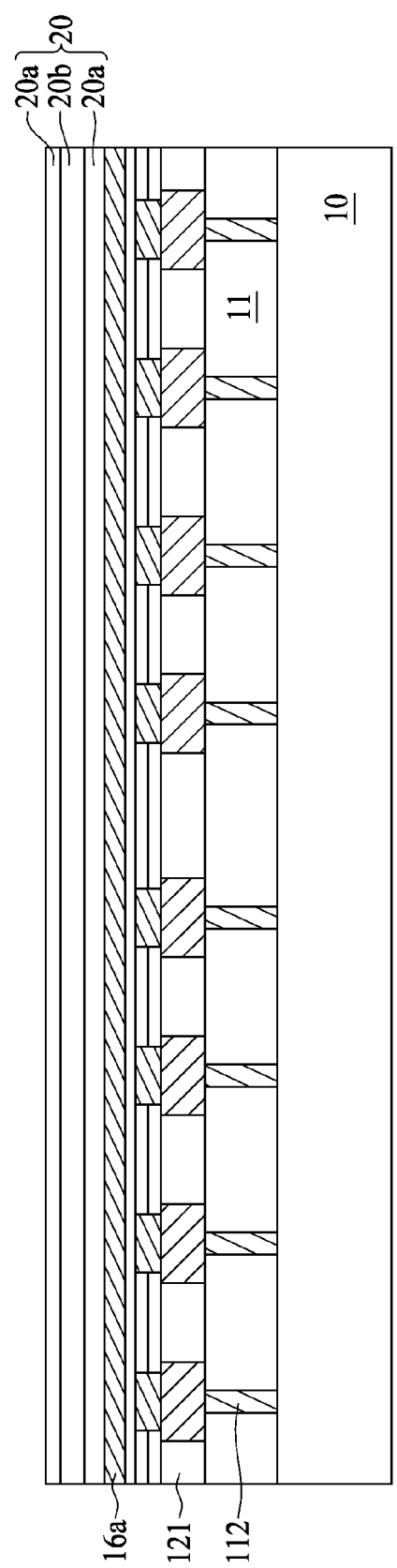
Figure 10:
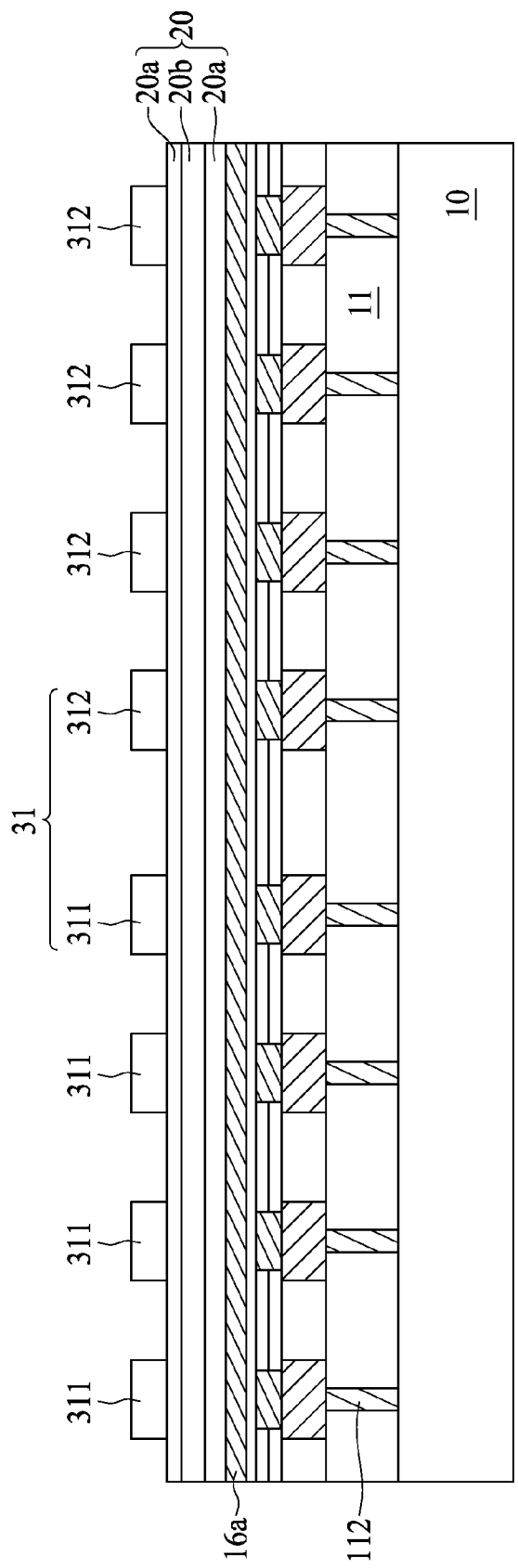

Referring to FIG. 1N, a mask layer 20 is formed on the conductive layer 16a. The mask layer 20 may have a multi-layer structure, which may include an oxide layer 20a, an advanced patterning film (APF) layer 20b and an oxide layer 20c. Each of the oxide layer 20a, the APF layer 20b and the oxide layer 20c may be formed by a variety of techniques, e.g., high-density ionized metal plasma (IMP) deposition, high-density inductively coupled plasma (ICP) deposition, sputtering, physical vapor deposition (PVD), chemical vapor deposition (CVD), low-pressure chemical vapor deposition (LPCVD), plasma-enhanced chemical vapor deposition (PECVD), and the like. The mask layer 20 may have a thickness ranging from approximately 4000 Å to approximately 8000 Å.

Referring to FIG. 1O, a patterned photoresist layer 31 may be formed by deep ultraviolet (DUV) photolithography on the mask layer 20. The patterned photoresist layer 31 may include a number of regions 311 and a number of regions 312. The regions 311 and regions 312 cover the mask layer 20. The size of each of the regions 311 is different from that of each of the regions 312. The size of each of the regions 311 is smaller than that of each of the regions 312.

Figure 1P:
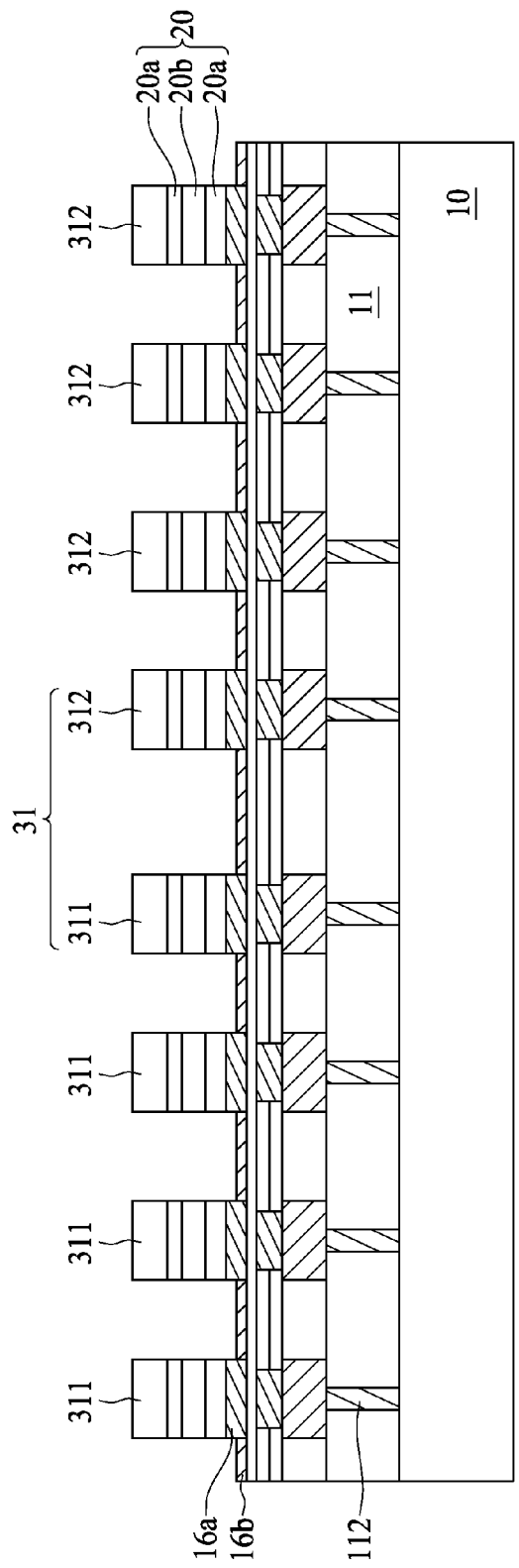

Referring to FIG. 1P, the uncovered mask layer 20 by the patterned photoresist layer 31 and a part of conductive layer 16a underlying the uncovered mask layer 20 are removed by etching technique. The unremoved conductive layer 16a has a thickness greater than that of the remnant 16b of the part of conductive layer 16a underlying the uncovered mask layer 20. The remnant 16b of the part of conductive layer 16a underlying the uncovered mask layer 20 may have a thickness ranging from approximately 50 Å to approximately 300 Å.

Figure 1Q:
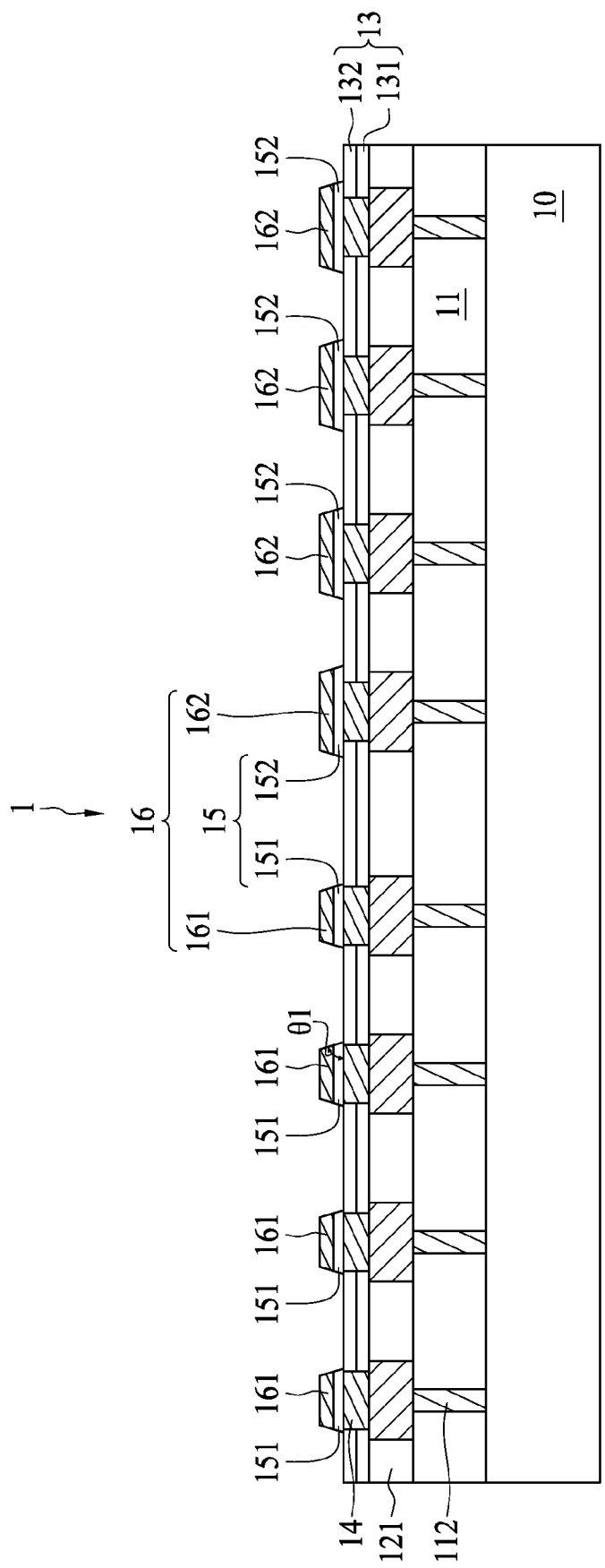

Referring to FIG. 1Q, the remnant 16b, the MTJ layer 15a underlying the remnant 16b, the patterned photoresist layer 31 and the unremoved mask layer 20 are removed by etching technique to form a semiconductor integrated circuit 1. The removal of the remnant 16b, the MTJ layer 15a underlying the remnant 16b, the patterned photoresist layer 31 and the unremoved mask layer 20 may leave a number of MTJ stacks/magneto-resistive memory cells 15 and a number of electrodes 16. The MTJ stacks 16 may include MTJ stacks 161 and MTJ stacks 162. The electrodes 16 may include electrodes 161 and electrodes 162. Each of the electrodes 161 is formed on each of the MTJ stack 151. Each of the electrodes 162 is formed on each of the MTJ stack 152. The MTJ stack 151 and the MTJ stack 152 are at the same elevation (e.g. on a top surface of the patterned dielectric layer 13).

The size of each of the MTJ stack 151 is different from that of each of the MTJ stack 152. The size of each of the MTJ stack 151 is smaller than that of each of the MTJ stack 152. A maximum width of the MTJ stack 151 is less than approximately 75 nanometer (nm). A minimum width of the MTJ stack 152 is equal to or greater than approximately 75 nm.

A side wall or side edge of the MTJ stack 151 and the top surface of the patterned dielectric layer 13 form an angle θ1. A side wall or side edge of the MTJ stack 152 and the top surface of the patterned dielectric layer 13 form an angle θ1. The angle θ1 may be greater than approximately 60°. The angle θ1 may range from approximately 70° to approximately 85°.

The size of each of the electrodes 161 is different from that of each of the electrodes 162. The size of each of the electrodes 161 is smaller than that of each of the electrodes 162. A side wall or side edge of the electrode 161 and a top surface of the MTJ stack 151 form an angle θ1. A side wall or side edge of the electrode 162 and a top surface of the MTJ stack 152 form an angle θ1. The angle θ1 may be greater than approximately 60°. The angle θ1 may range from approximately 70° to approximately 85°.

Figure 3:
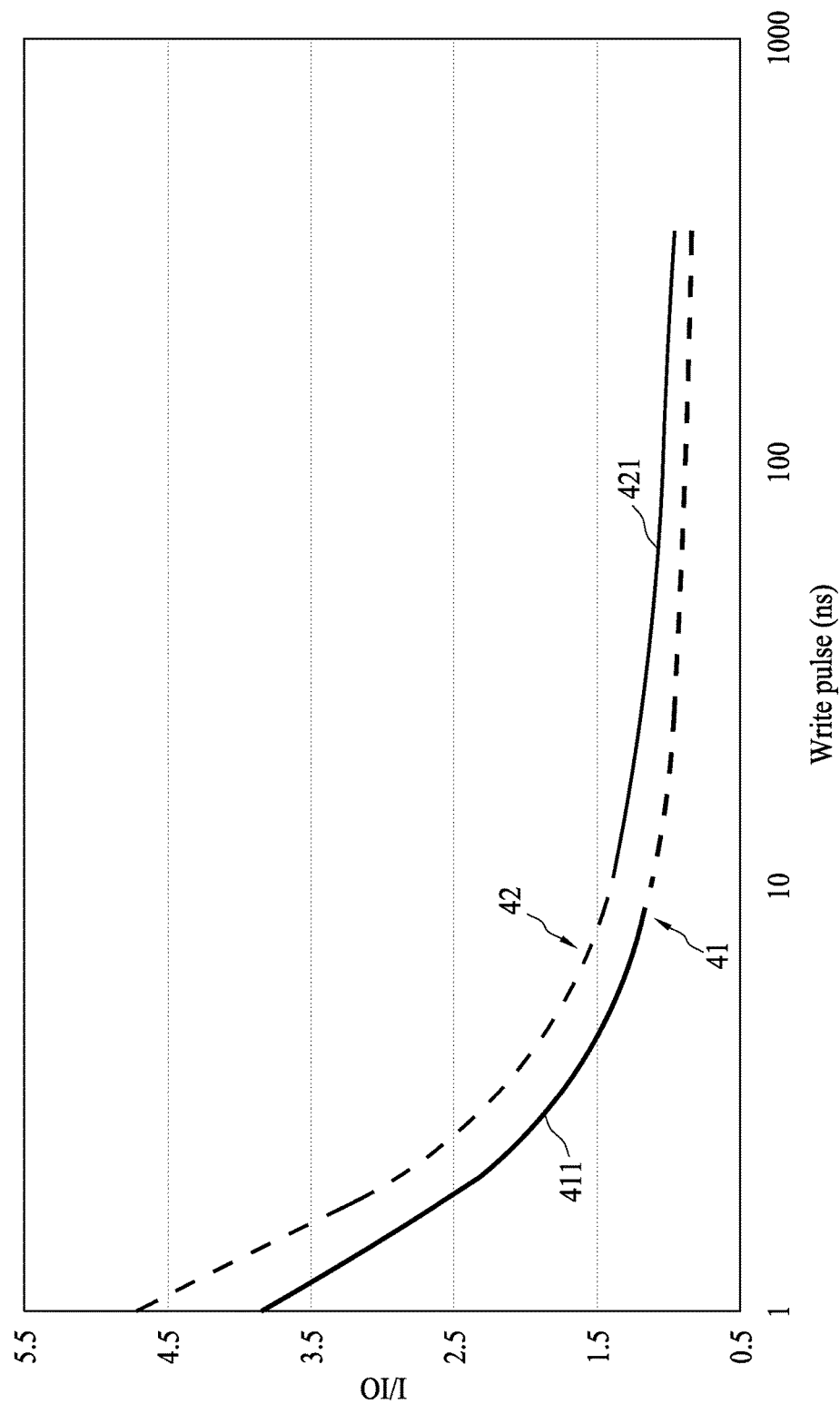
FIG. 3 illustrates relation of write current to write pulse in accordance with some embodiments of the present disclosure.

Operation of the magneto-resistive memory cells 151 and 152 may refer to the following description with reference to FIG. 3.

Referring to FIG. 3, which illustrates relation of write current to write pulse in accordance with some embodiments of the present disclosure. A vertical axis as shown in FIG. 3 displays a ratio of a write current (I) to a reference write current ($I_0$) at a write speed of 1 nano second (ns). Curve 41 represents a write operation performed on a magneto-resistive memory cell 151. Curve 42 represents a write operation performed on a magneto-resistive memory cell 152. A minimum or threshold current to write data into a magneto-resistive memory cell 151 at a certain speed (i.e., write pulse) is less than a minimum or threshold current to write data into a magneto-resistive memory cell 152. For example, under the condition that a width of the MTJ stack is about 75 nm, the magneto-resistive memory cell 151 may be switched from a resistance level to another resistance level for a predetermined duration (e.g. 1.5 ns) by a write threshold of approximately 550-720 μA. For example, under the condition that a width of the MTJ stack is about 75 nm, the magneto-resistive memory cell 151 may be switched from a resistance level to another resistance level for a predetermined duration (e.g. 10 ns) by a write threshold of approximately 360-400 μA. For another example, under the condition that a width of the MTJ stack is about 85 nm, the magneto-resistive memory cell 152 may be switched from a resistance level to another resistance level for a predetermined duration (e.g. 250 ns) by a write threshold of approximately 300-330 μA.

The solid part 411 of curve 41 represents an application region of a magneto-resistive memory cell 151 as illustrated and described with reference to FIG. 1Q. The magneto-resistive memory cell 151 may function as an SRAM at a write speed or a write pulse less than 10 ns. The solid part 421 of curve 42 represents an application region of a magneto-resistive memory cell 152 as illustrated and described with reference to FIG. 1Q. The magneto-resistive memory cell 152 may function as a Flash memory at a write speed or a write pulse equal to or greater than 10 ns but with better temperature retention.

Figure 1R:
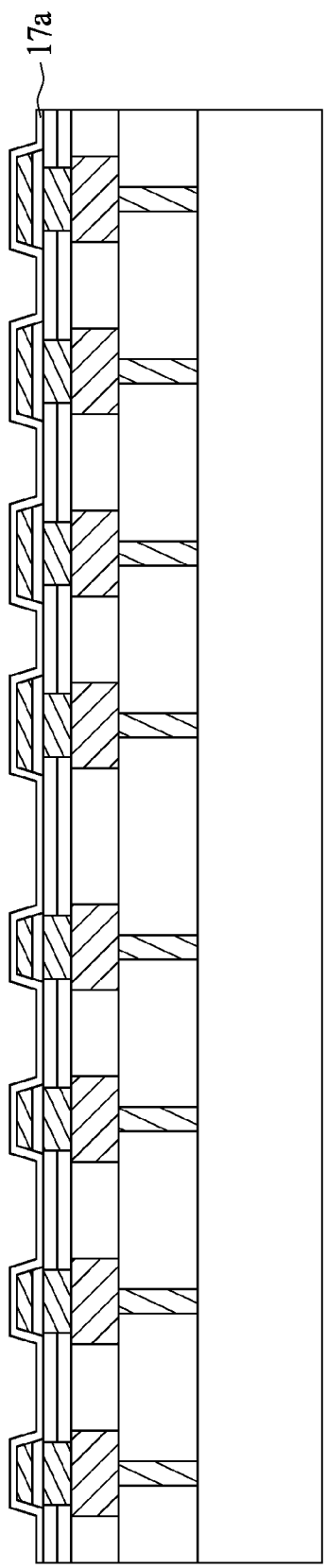

Referring to FIG. 1R, a dielectric layer 17a is formed on the patterned dielectric layer 13 by same or similar techniques as illustrated and described with reference to FIG. 1B. The dielectric layer 17a may have material the same or similar to that of the dielectric layer 11 as illustrated and described with reference to FIG. 1B. The dielectric layer 17a covers the patterned dielectric layer 13, the MTJ stacks 15 and the electrodes 16.

Figure 1S:
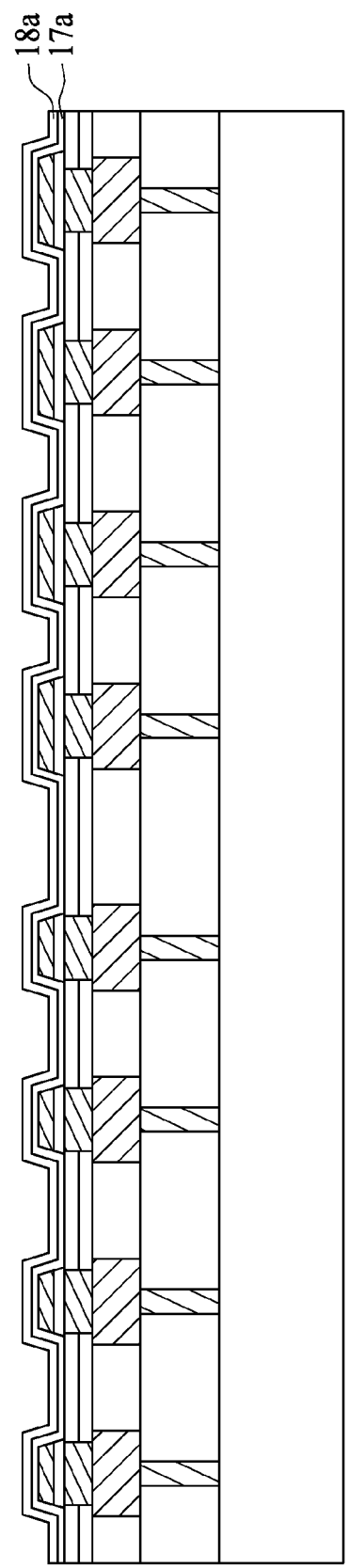

Referring to FIG. 1S, an oxide layer 18a is formed on the dielectric layer 17a by a variety of techniques for forming such layers, e.g., chemical vapor deposition (CVD), low-pressure CVD (LPCVD), plasma-enhanced CVD (PECVD), sputtering and physical vapor deposition (PVD), thermal growing, and the like.

Figure 1T:
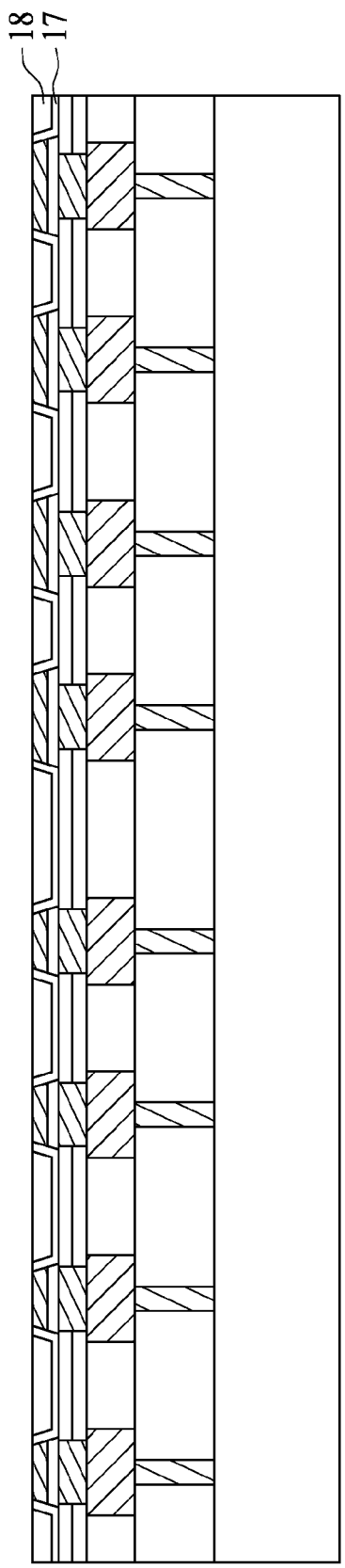

Referring to FIG. 1T, part of the dielectric layer 17a and part of the oxide layer 18a are removed by photolithographic technique, planarization technique or the like to form a patterned dielectric layer 17 and a patterned oxide layer 18 to expose the electrodes 16. The patterned dielectric layer 17 may function as a spacer.

Figure 1U:
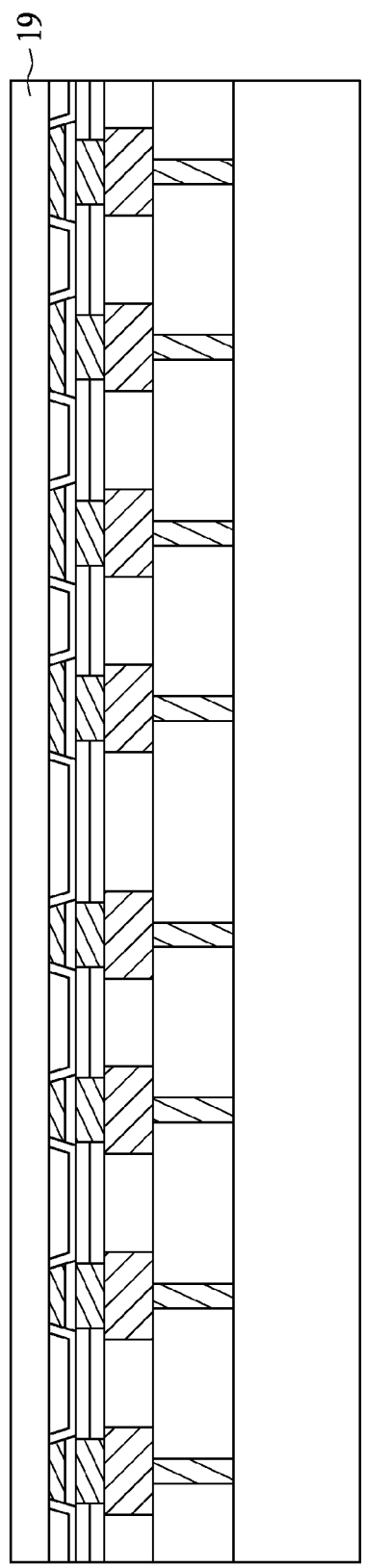

Referring to FIG. 1U, a dielectric layer 19 is formed on the exposed electrodes 16, the patterned dielectric layer 17 and the patterned oxide layer 18 by same or similar techniques as illustrated and described with reference to FIG. 1B. The dielectric layer 19 may have material the same or similar to that of the dielectric layer 11 as illustrated and described with reference to FIG. 1B.

Figure 1V:
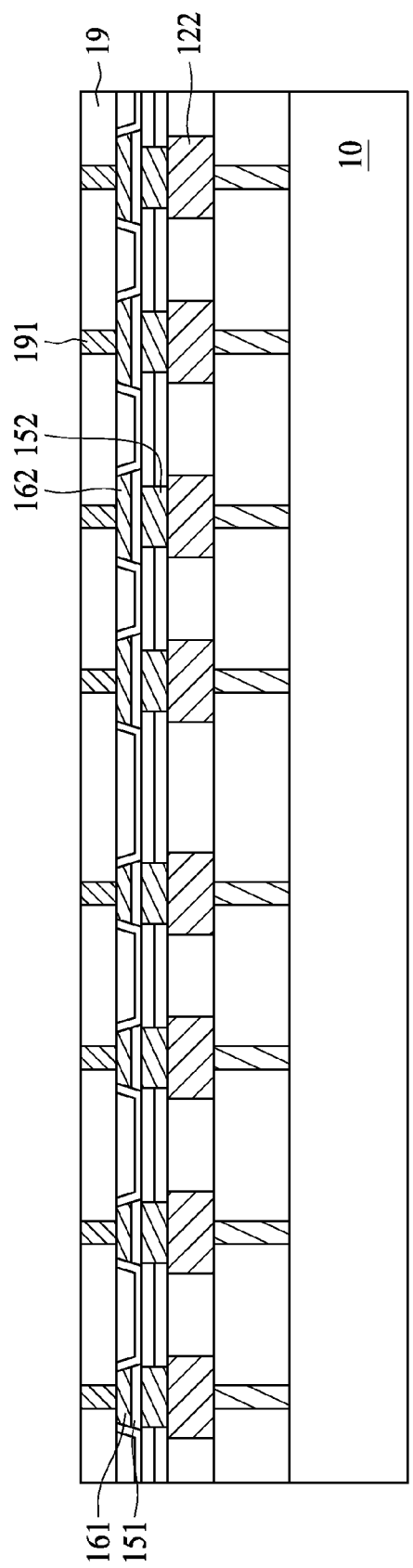

Referring to FIG. 1V, a number of vias 191 are formed in the dielectric layer 19 by same or similar techniques as illustrated and described with reference to FIG. 1C and FIG. 1D. The vias 191 may have material the same or similar to that of the vias 112 as illustrated and described with reference to FIG. 1D.

Figure 1W:
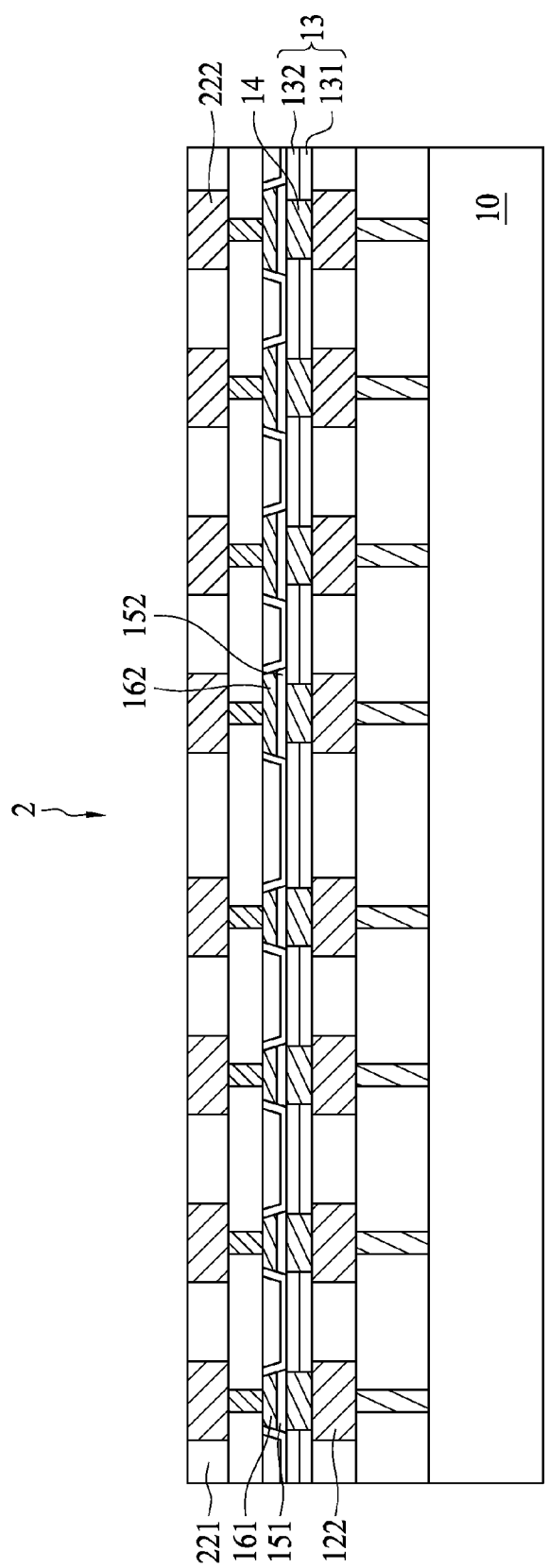

Referring to FIG. 1W, a patterned dielectric layer 221 and a patterned conductive layer 222 are formed on the dielectric layer 19 and the vias 191 to form a semiconductor integrated circuit 2. The patterned dielectric layer 221 and the patterned conductive layer 222 may be formed by same or similar techniques as illustrated and described with reference to FIG. 1E, FIG. 1F and FIG. 1G. The patterned dielectric layer 221 may have a structure the same or similar to that of the patterned dielectric layer 121 as illustrated and described with reference to FIG. 1G. The patterned conductive layer 222 may have a structure the same or similar to that of the patterned conductive layer 122 as illustrated and described with reference to FIG. 1G.

Figure 2:
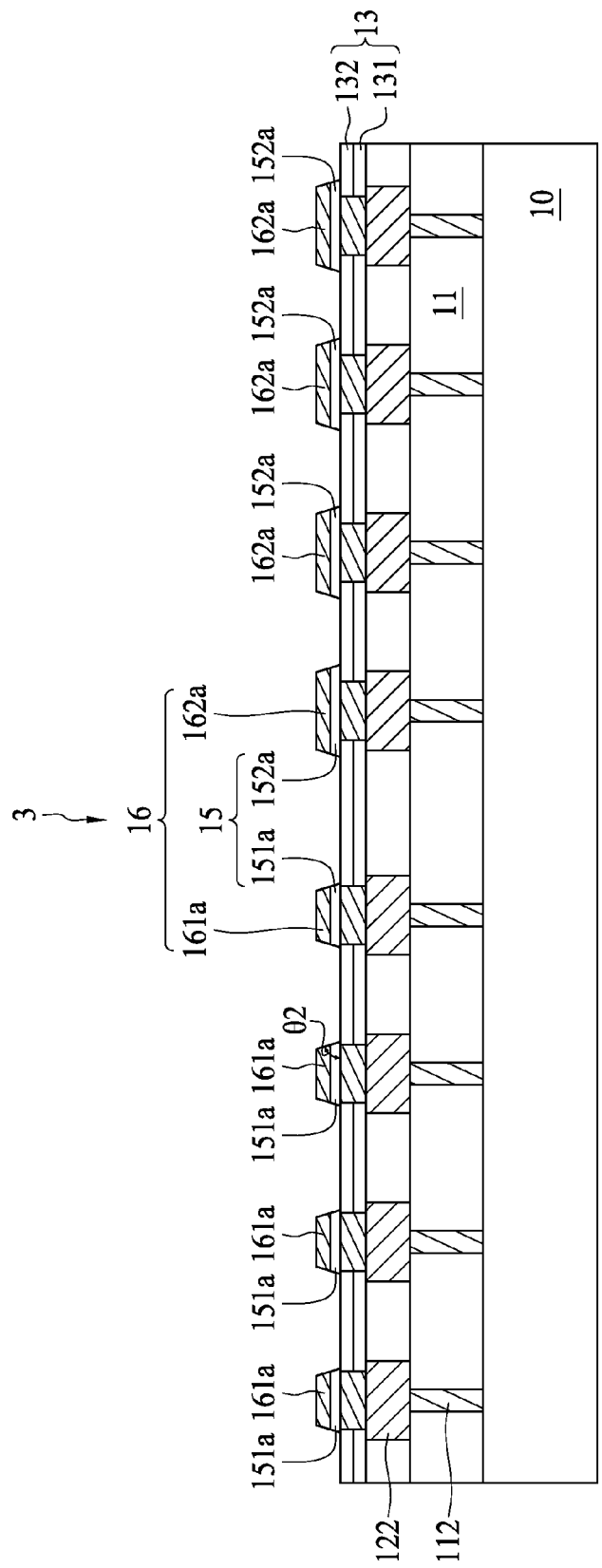
FIG. 2 illustrates a semiconductor integrated circuit in accordance with some embodiments of the present disclosure.

FIG. 2 illustrates a semiconductor integrated circuit in accordance with some embodiments of the present disclosure. Referring to FIG. 2, a semiconductor integrated circuit 3 is similar to the semiconductor integrated circuit 1 except that the MTJ stacks 151 and 152 and the electrodes 161 and 162 are replaced by MTJ stacks 151a and 152a and electrodes 161a and 162a.

Each of the MTJ stacks 151a is similar to each of the MTJ stacks 151 except that a side wall or side edge of the MTJ stack 151a and the top surface of the patterned dielectric layer 13 form an angle θ2. Each of the MTJ stacks 152a is similar to each of the MTJ stacks 152 except that a side wall or side edge of the MTJ stack 152a and the top surface of the patterned dielectric layer 13 form an angle θ2. The angle θ2 may be less than approximately 60°.

Each of the electrodes 161a is similar to each of the electrodes 161 except that a side wall or side edge of the electrode 161a and a top surface of the MTJ stack 151a form an angle θ2. Each of the electrodes 162a is similar to each of the electrodes 162 except that a side wall or side edge of the electrode 162a and a top surface of the MTJ stack 152a form an angle θ2. The angle θ2 may be less than approximately 60°.

The semiconductor integrated circuit 3 may be formed by a method similar to the method as described and illustrated with reference to FIG. 1A, FIG. 1B, FIG. 1C, FIG. 1D, FIG. 1E, FIG. 1F, FIG. 1G, FIG. 1H, FIG. 1I, FIG. 1J, FIG. 1K, FIG. 1L, FIG. 1M, FIG. 1N, FIG. 1O, FIG. 1P and FIG. 1Q, except that the operation as shown in FIG. 1P is eliminated. Referring to FIG. 1O, the MTJ layer 15a, the conductive layer 16a and the mask layer 20 uncovered by the patterned photoresist layer 31 are removed in one single operation to form the semiconductor integrated circuit 3 as shown in FIG. 2.

Referring back to FIG. 1P where a two-stage etch is conducted for a semiconductor integrated circuit 2 as shown in FIG. 1W, it is contemplated that a majority of the conductive layer 16a are removed such that merely a few remnants 16b are left. Accordingly, when the operation as shown in FIG. 1Q is performed in a different station from that of FIG. 1P, there may be relatively less remnants 16b deposited on side walls of the MTJ stacks 15 so as to avoid malfunction of the MTJ stacks 15. In addition, a lateral etch for the MTJ layer is milder since the sidewall of the MTJ layer starts to be exposed to a tailored etching environment in a later stage of a different station, and hence, a greater angle θ1, as opposed to a smaller angle θ2, can be obtained.

However, under a condition when a single-stage etch is conducted for a semiconductor integrated circuit 3 as shown in FIG. 2, a more generatl, single etching chemistry is adoped to remove the MTJ layer 15a, the conductive layer 16a and the mask layer 20. The lateral etch for the MTJ layer is more severe since the sidewall of the MTJ layer starts to be exposed to a general etching environment in an earlier stage of a same station, and hence, a smaller angle θ2, as opposed to a greater angle θ1, can be obtained.

In accordance with some embodiments of the present disclosure, a semiconductor integrated circuit includes a substrate, a first patterned conductive layer, a first magnetic tunnel junction (MTJ) stack and a second MTJ stack. The first patterned conductive layer is over the substrate. The first MTJ stack, which is over the first patterned conductive layer, has a first size. The second MTJ stack, which is over the first patterned conductive layer, has a second size different from the first size.

In accordance with some embodiments of the present disclosure, a semiconductor integrated circuit includes a substrate, a first patterned conductive layer, a first magneto-resistive memory cell and a second magneto-resistive memory cell. The first patterned conductive layer is over the substrate. The first magneto-resistive memory cell, which is over the first patterned conductive layer, is switched from a first resistance level to a second resistance level for a predetermined duration by a first write threshold. The second magneto-resistive memory cell, which is over the first patterned conductive layer, is switched from the first resistance level to the second resistance level for the predetermined duration by a second write threshold greater than the first write threshold.

In accordance with some embodiments of the present disclosure, a method of manufacturing a semiconductor integrated circuit includes: providing a substrate; forming a first patterned conductive layer over the substrate; forming a second patterned conductive layer on the first patterned conductive layer; and forming a patterned MTJ stack layer on the second patterned conductive layer, the patterned MTJ stack layer having a first MTJ stack of a first size and a second MTJ stack of a second size, the first size being different from the second size.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor integrated circuit, comprising:
   a substrate;
   a first patterned conductive layer over the substrate;
   a Static Random Access Memory (SRAM) region, comprising:
      a plurality of first magnetic tunnel junction (MTJ) stacks, over the first patterned conductive layer, each of the plurality of first MTJ stacks having a first size; and
   a Flash memory region, comprising:
      a plurality of second MTJ stacks over the first patterned conductive layer, each of the plurality of second MTJ stacks having a second size different from the first size.

2. The semiconductor integrated circuit of claim 1, wherein a maximum width of the plurality of first MTJ stacks is less than approximately 75 nanometer (nm).

3. The semiconductor integrated circuit of claim 1, wherein a minimum width of the plurality of second MTJ stacks is equal to or greater than approximately 75 nm.

4. The semiconductor integrated circuit of claim 1, wherein the plurality of first MTJ stacks and the plurality of second MTJ stacks are at the same elevation.

5. The semiconductor integrated circuit of claim 4 further comprising:
   a second patterned conductive layer between the plurality of first MTJ stacks and the first patterned conductive layer, and between the plurality of second MTJ stacks and the first patterned conductive layer; and
   a first dielectric layer, laterally surrounding the second patterned conductive layer, having a top surface adjacent to the plurality of first MTJ stacks and the plurality of second MTJ stacks,
   wherein a side edge of one of the plurality of first MTJ stacks or one of the plurality of second MTJ stacks and the top surface of the first dielectric layer form an angle greater than approximately 60°.

6. The semiconductor integrated circuit of claim 5, wherein the angle ranges from approximately 70° to approximately 85°.

7. The semiconductor integrated circuit of claim 4 further comprising:
   a second patterned conductive layer, directly on the plurality of first MTJ stacks, having a third size; and
   a third patterned conductive layer, directly on the plurality of second MTJ stacks, having a fourth size different from the third size.

8. The semiconductor integrated circuit of claim 7, wherein a side edge of the second patterned conductive layer and a top surface of one of the plurality of first MTJ stacks form an angle greater than approximately 60°.

9. The semiconductor integrated circuit of claim 7, wherein a side edge of the third patterned conductive layer and a top surface of one of the plurality of second MTJ stacks form an angle greater than approximately 60°.

10. A semiconductor integrated circuit, comprising:
    a first patterned conductive layer over the substrate;
    a Static Random Access Memory (SRAM) region, comprising:
       a plurality of first magneto-resistive memory cells connected to a first transistor region, over the first patterned conductive layer, being switched from a first resistance level to a second resistance level for a predetermined duration by a first write threshold; and
    a Flash memory region, comprising:
       a plurality of second magneto-resistive memory cells connected to a second transistor region, over the first patterned conductive layer, being switched from the first resistance level to the second resistance level for the predetermined duration by a second write threshold greater than the first write threshold.

11. The semiconductor integrated circuit of claim 10, wherein the plurality of first magneto-resistive memory cells and the plurality of second magneto-resistive memory cells are at the same elevation.

12. The semiconductor integrated circuit of claim 11 further comprising:
    a second patterned conductive layer between the plurality of first magneto-resistive memory cells and the first patterned conductive layer, and between the plurality of second magneto-resistive memory cells and the first patterned conductive layer; and
    a first dielectric layer, laterally surrounding the second patterned conductive layer, having a top surface adjacent to the plurality of first magneto-resistive memory cells and the plurality of second magneto-resistive memory cells,
    wherein a side edge of one of the plurality of first magneto-resistive memory cells or one of the plurality of second magneto-resistive memory cells and the top surface of the first dielectric layer form an angle greater than approximately 60°.

13. The semiconductor integrated circuit of claim 12, wherein the angle ranges from approximately 70° to approximately 85°.

14. The semiconductor integrated circuit of claim 10 further comprising:
    a second patterned conductive layer, directly on the plurality of first magneto-resistive memory cells, having a first size; and
    a third patterned conductive layer, directly on the plurality of second magneto-resistive memory cells, having a second size different from the first size.

15. A semiconductor integrated circuit, comprising:
    a Static Random Access Memory (SRAM) region composed of only a plurality of first magneto-resistive memory cells, being switched from a first resistance level to a second resistance level for a predetermined duration by a first write threshold;
    a Flash memory region composed of only a plurality of second magneto-resistive memory cells, over the first patterned conductive layer, being switched from the first resistance level to the second resistance level for the predetermined duration by a second write threshold different from the first write threshold;

wherein the plurality of first magneto-resistive memory cells and the plurality of second magneto-resistive memory cells are at the same elevation.

16. The semiconductor integrated circuit of claim 15, wherein the plurality of first magneto-resistive memory cells comprises a first magnetic tunnel junction having a first width from a cross sectional perspective, and the plurality of second magneto-resistive memory cells comprises a second magnetic tunnel junction having a second width from a cross sectional perspective, the first width is smaller than the second width.

17. The semiconductor integrated circuit of claim 15, further comprising a patterned conductive layer under the plurality of first magneto-resistive memory cells and the plurality of second magneto-resistive memory cells.

18. The semiconductor integrated circuit of claim 15, wherein one of the plurality of first magneto-resistive memory cells further comprises a first electrode, and one of the plurality of second magneto-resistive memory cells further comprises a second electrode, a width of the first electrode is smaller than a width of the second electrode.

19. The semiconductor integrated circuit of claim 15, wherein the plurality of first magneto-resistive memory cells is a Static Random Access Memory.

20. The semiconductor integrated circuit of claim 15, wherein the plurality of second magneto-resistive memory cells is a flash memory.

* * * * *